July 7, 1959 E. J. H. BUSSARD 2,894,211

STABLE TRANSISTOR OSCILLATOR SYSTEM

Filed Nov. 28, 1956

INVENTOR.
EMMERY J. H. BUSSARD.
BY Alden D. Redfield.
Irvin P. Garfinkle
ATTORNEYS.

2,894,211

STABLE TRANSISTOR OSCILLATOR SYSTEM

Emmery J. H. Bussard, Cincinnati, Ohio, assignor to Avco Manufacturing Corporation, Cincinnati, Ohio, a corporation of Delaware Application November 28, 1956, Serial No. 624,877

12 Claims. (Cl. 331—117)

This invention relates generally to high frequency transistor sine wave generator systems, and more particularly to dominant positive feedback type sine wave generators employing transistors.

A principal problem in the use of transistors in generator or oscillator circuits is the inherent instability of the transistor wherein small changes in temperature, bias, and/or other operating conditions, or tolerances in the internal parameters of transistors cause serious frequency and generated power variations. Since there are many applications where transistors will be advantageous and desirable in oscillator circuits, it is the primary object of this invention to provide a transistor oscillator system which will give frequency stable performance and be tunable over a wide frequency range, and which can use the various types of commercial transistors with good efficiency.

Another object of this invention is to produce a dominant positive feedback type of transistor oscillator in which the effects of internal impedance parameter variations of the transistor will be made negligible.

It is another object of this invention to produce an oscillator utilizing the advantages of both current and voltage, and positive and negative feedback for sustaining and regulating oscillations.

Another object is the provision of a stable high frequency transistor oscillator having very low effective impedances.

Still another object of this invention is to provide automatic means for self adjustment of the transistor to its best operationg conditions in the oscillator system, and to make full use of the voltage and current amplifying qualities of the transistor to improve the efficiency and regulation of the circuit.

The nature and operation of this invention will be more readily apparent from a study of the following detailed description of the preferred embodiments of the invention, and from the accompanying drawings, in which.

In the preferred embodiment, use is made of an NPN transistor 10, having a grounded base 11, an emitter 12, and a collector 13. The grounded base transistor 10 is a junction type transistor and is connected common emitter, i.e., the emitter 12 is common to the input circuit between the base 11 and emitter 12 and to the output circuit between the emitter 12 and collector 13. It is to be understood, however, that this invention is also applicable with other types of transistors which may be connected common base or common collector with any one of the elements grounded by such appropriate alterations in the circuitry as are known in the transistor art.

Figure 1:
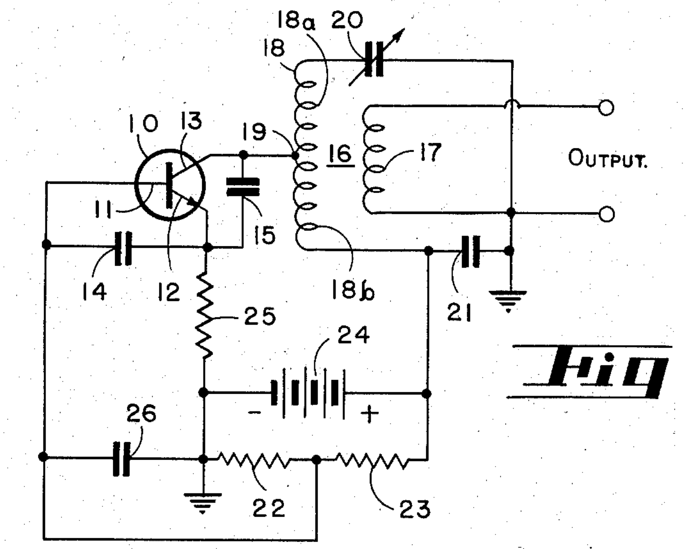
Figure 1 is a schematic representation of a preferred embodiment of the invention.

It has been found, however, that maximum efficiency and desired performance is achieved with the preferred arrangement of Figure 1.

A condenser 14 connected from the base 11 to the emitter 12 and a condenser 15 connected from the emitter 12 to the collector 13 form a capacitive divider from the base 11 to collector 13 for sustaining positive feedback from the output circuit to the input circuit. Also connected between the base and collector are a tunable resonant circuit 16 having an output coupling winding 17 for coupling the output of the oscillator to appropriate consuming circuits, and a tunable autotransformer 18 tapped at 19 and comprising two winding sections *18a* and *18b*. The winding section *18a* in series with the variable condenser 20 provides a series resonant tank in circuit with the collector to ground. The tapped portion *18b* is inductively coupled to and connected across the series resonant tank for a purpose hereinafter described. A D.C. blocking condenser 21 is shown in circuit with the winding *18b*; however, it is to be understood that so long as the power source can be grounded, the condenser 21 need not be used, and the connection of the winding *18b* directly to ground may be preferable.

The biasing network for the system comprises a resistance divider network consisting of resistors 22 and 23 connected across the terminals of a battery 24 or any other suitable source of D.C. power. The biasing resistor 22, which is connected to the negative side of the battery 24, provides a negative biasing potential for the emitter 12 of the NPN type transistor 10 through a series type negative feedback resistor 25. The resistor 23, connected to the positive side of battery 24, and the resistor 22, provide a positive bias for the collector 13. The A.C. circuit of the base 11 is grounded through the D.C. blocking condenser 26, while the D.C. return of base 11 is connected to the junction between resistors 22 and 23.

In dominant positive feedback oscillators, it is necessary that a portion of the output signal be fed back to the input circuit in a sense cumulative to the input signal. For this purpose the capacitive voltage divider consisting of capacitors 14 and 15 selected in accordance with the known Barkhausen criteria are connected, respectively, in the input and output circuits. Although a transistor is capable of amplifying both voltage and current, it is basically a current amplifying device; therefore, the invention advantageously uses this characteristic by employing the high Q circuit 16 including the autotransformer winding 18 and the condenser 20. By means of the tap at 19, the circuit 16 comprises both a series resonant tank and a low impedance shunt winding *18b* which are connected across the terminals of the base 11 and collector 13. In practice, the shunt winding *18b* constitutes a small portion, about 12%, of the windings of the autotransformer 18. By means of the current transformation between the series resonant tank and the tapped winding section *18b*, extremely large currents are produced and fed back to the transistor. Positive feedback is applied to the transistor from across the capacitive divider 14, 15.

In starting, with the base 11 connected to the junction between resistors 22 and 23, the base is initially biased well towards the collector; in practice, about 55% of the collector emitter voltage is applied to the base. This sets up a condition conducive to high current flow in the transistor emitter-base circuit which induces a high current surge in the circuit including the collector 13, the emitter 12, the series type negative feedback resistance 25 and the resonant circuit 16. The high current surge shocks the winding section *18b* of the resonant circuit thereby inducing oscillations, and a surge current is fed back across the divider circuit comprising the condensers 14 and 15 which are of the correct value and phase to satisfy the Barkhausen criteria for sustained oscillations. Oscillations start to build up causing current to flow in the emitter circuit and through the emitter resistance 25.

It is noted that the magnitude of current flow in the collector circuit depends on the base to emitter bias which is determined by the voltage across the condenser 14, and that condenser 14 is connected across both the resistors 25 and 22. Since the voltage across the resistor 25 is developed by emitter current flow and is opposite in polarity to that produced by the bias battery 24 across resistor 22, the voltage on condenser 14 will be the difference of the two voltages, and therefore the oscillations will continue to build up until a balanced running condition is achieved by the opposing voltages across the resistances 22 and 25. Thus, the biasing arrangement consisting of the resistors 22, 23, and 25 in conjunction with the condenser 14 provides automatic means for self adjustment of the transistor to its best operating conditions in the oscillator system, and maintains a stable power flow. It is seen, therefore, that resistor 25 is a parameter used to establish output level of the oscillator system. The controls of the system are such that forced oscillations start under the most favorable conditions and are automatically "throttled" back and held at the desired operating level by the series type negative feedback. Because of its current amplifying property, the transistor inherently favors the balancing feedback control which is not obtainable in the same degree in vacuum tube circuits. The negative feedback emitter resistor 25 can be made manually variable to control the output power over a wide range.

Under operating conditions, the collector current is driven from near zero to about two times its static value. This change in current develops a simultaneous change in voltage across capacitor 15 which is in series with capacitor 14. The capacitors 14 and 15 are across winding 18*b* so that a voltage is fed back to the input in about 180 degree phase relationship and the tank circuit is excited at resonance by the coupling winding 18*b*. The series tank circuit 18*a* and 20 is tightly coupled to and is connected across the winding 18*b* and the positive feedback network as a whole so that it presents a resistance load at resonance. This resistance load constitutes a shunt-type negative feedback path. At frequencies on either side of resonance a phase shift and a much higher impedance is produced because of the relatively high operating Q's in the tank circuit, and therefore, the current in the tank circuit is reduced. When the source of positive feedback across the capacitive circuit decreases off resonance such that oscillations would tend to cease, the base bias is increased by reduced negative feedback to maintain oscillations at the resonant frequency of the tank circuit. Thus it is seen that changes in transistor characteristics are automatically compensated by the associated signal generating circuit.

Figure 2:
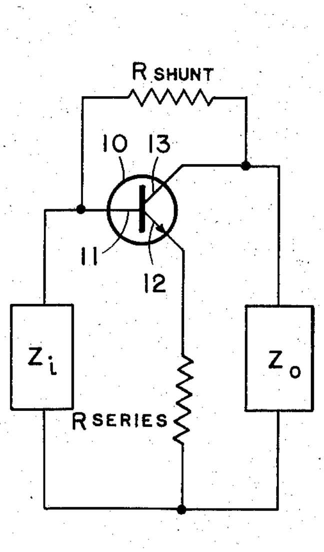
Figure 2 illustrates the operation of a basic feedback circuit.
Figure 3:
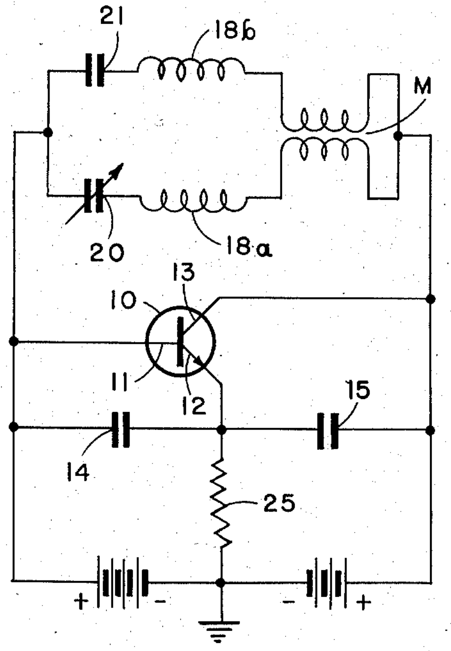
Figure 3 is a simplified schematic illustrating the theory of the operation of the preferred embodiment of the invention shown in Figure 1.

The theory of operation of the negative feedback circuits may be more readily understood by reference to Figures 2 and 3. Figure 2 is a basic circuit illustrating the negative feedback system of Figure 1, and it shows the transistor 10 with the various capacitive, resistive and inductive impedances lumped in the input circuit as $Z_1$ and in the output circuit as $Z_o$. The $R_{series}$ constitutes a series feedback resistance and is equivalent to resistor 25, while $R_{shunt}$ represents the shunt feedback resistance of the circuit. Since the transistor 10 is connected common emitter, the circuit has a 180 degree phase shift, and negative feedback is supplied from the output to the input through the shunt resistance $R_{shunt}$. This produces a reduction in gain, and a reduction in input and output impedance. The series feedback resistor $R_{series}$ produces a negative feedback which results in increased input and output impedances, and decreased gain.

The arrangement shown in Figure 3 is a simplified representation of Figure 1 and for the purpose of more fully illustrating the operation of the circuit, the mutual inductance M between the winding sections 18*a* and 18*b* is also included. At the resonant frequency, the impedance between points *a* and *b* is essentially resistive; however, this impedance changes rapidly and shifts phase either side of resonance such that the current is reduced in the tank 16, and particularly in the leg containing the element 18*a* and 20. But the total network including the tank 16 and the capacitive divider 14, 15 functions as an equivalent parallel resonant system such that current in the inductive legs decreases at frequencies above resonance, and simultaneously increases in the capacitive leg, and vice versa. Off resonance, the negative feedback decreases due to reduced current flow in $R_{shunt}$, but the shift in current and phase in the inductive and capacitive legs functions to maintain the correct frequency and impedance relationship. Since the impedances $Z_1$ and $Z_o$ are directly dependent on the magnitudes and phase relationships of the feedbacks, these feedbacks function to partially buck each other. Both affect total gain directly, but the voltage and current gains are affected to a different and varying degree to stabilize operation.

The use of the tapped winding or autotransformer 18 produces other advantageous results. In order that replacement transistors with wide tolerances can be substituted in the circuit, and so that changes in temperature and other operating conditions will not materially vary the frequency of operation of the system, the effects of variations in the internal parameters of the transistor 12 must be minimized. For this purpose the dynamic impedances of the circuit from collector to emitter, emitter to base, and base to collector must be very low. Because of the shunting effect of the tapped winding section 18*b* across the winding section 18*a* and capacitor 20, a materially lower impedance is created by the tank circuit 16 than would exist if the series resonant circuit 18*a* and 20 were used alone. Because of the low impedance in the tank circuit 16, a lower operating impedance is permitted in the capacitive divider network 14, 15, and hence, very large condensers may be used. As a result of this, the internal capacities of the transistors become a minor part of the over-all capacity of the system, and the effect of the transistor capacity variations is negligible. Moreover, the internal resistances of the transistor are also "swamped" by low impedances produced across the transistor electrodes by the additional shunting effect of the winding section 18*b*.

The frequency of the oscillator system is determined by the resonant frequency of the three shunt legs, i.e. the series resonant circuit 18*a* and 20, the shunt winding section 18*b* and the mutual inductance between the winding sections 18*b* and 18*a*, and the capacitive divider network 14 and 15. The resonant frequency may be varied by means of the tunable condenser 20.

By way of illustration, a circuit incorporated as the local oscillator in a superheterodyne receiver and constructed in accordance with Figure 1, and with the circuit parameters outlined below, exhibited uniform drive (within 2 db voltage variations) across a band of 985 kc. to 2075 kc. and was insensitive to load variations. The circuit accepted a wide range of transistor tolerances. The typical circuit parameters for such operation are:

| | |
|---|---|
| Transistor 10 | Type 2N94. |
| Capacitor 14 | .0022 uf. |
| Capacitor 15 | 680 uuf. |
| Capacitor 26 | .01 uf. |
| Capacitor 21 | .1 uf. |
| Capacitor 20 | 27–117 uuf. |
| Winding 18 | 224 uh. |
| Resistor 22 | 47 k.—ohm. |
| Resistor 23 | 39 k.—ohm. |
| Resistor 25 | 8.2 k.—ohm. |
| Power source 24 | 3–9 volts. |

The transistor oscillator circuits herein disclosed provide: (1) automatic adjustment to compensate for variation in transistor parameters, (2) automatic signal strength control, (3) very positive starting, (4) very high efficiency, (5) constant level output with frequency variation over a relatively wide range, and (6) stable frequency operation practically independent of change in transistor parameters, D.C. voltage drive, output load and ambient temperature. These are major improvements in modern high frequency transistor oscillators which represent a major advance in the art and science of signal generators.

I claim:

1. A high frequency oscillator system comprising a transistor having a base, an emitter and a collector, an input circuit between said base and said emitter, an output circuit between said collector and said emitter, means for biasing said transistor to produce current flow in said output circuit, a resonant network circuit connected from said output circuit to said input circuit for providing positive feedback, said resonant network including positive voltage feedback means comprising a parallel resonant circuit, and positive current feedback means to start and sustain oscillations in said system, said positive current feedback means comprising a tuned, high Q, series resonant circuit.

2. The combination as defined in claim 1, and negative feedback between said input and said output circuits for regulating the oscillations in said system.

3. An oscillator system comprising a transistor having a base, a common emitter and a collector, a capacitive voltage divider network consisting of two condensers, one of said condensers being connected between said collector and said emitter, the other of said condensers being connected between said emitter and said base, a series resonant tank circuit connected from said collector to said base, a low impedance inductor shunted across said series resonant tank circuit, means for biasing said transistor elements to cause current flow from said emitter through said collector, said resonant tank circuit and said low impedance inductor, whereby signals are fed back to said capacitive divider network to positively start and sustain oscillations of said system.

4. The combination as defined in claim 3, and a resistor connected in circuit with said emitter for supplying series type negative feedback from said tank circuit to said transistor for regulating the oscillations of said transistor.

5. An oscillator comprising a transistor having an input element, an output element, and an element common to said input and said output elements, an input circuit connected between said input element and said common element, an output circuit connected between said output element and said common element, means for biasing said transistor to produce current flow in said output circuit, a low impedance current generating network and a high impedance voltage generating network connected across said input circuit and said output circuit for feeding back a portion of the current and voltage signals in said networks to said input circuit to start, sustain and regulate oscillations in said transistor.

6. The invention as defined in claim 5, wherein said input circuits and said output circuit each comprises a condenser arranged to provide a capacitive divider network connected from said output element to said common element, and from said common element to said input element.

7. A high frequency oscillator system comprising a transistor having an input circuit and an output circuit, said circuits comprising a capacitive voltage divider network, a series resonant circuit connected across said capacitive voltage divider network for feeding back a positive signal to said input circuit through said divider network, and additional means shunted across said series resonant circuit for reducing the impedance of the system and for producing a large positive current feedback to said input circuit through said divider network.

8. The combination as defined in claim 7, and additional means for applying a negative feedback signal from said output circuit to said input circuit for regulating the oscillations of said system.

9. The invention as defined in claim 7 wherein said means for reducing the impedance of the system and for producing a large current feedback to said input circuit comprises a low impedance inductor shunted across said output circuit.

10. The invention as defined in claim 9 wherein said low impedance inductor is inductively coupled to said series resonant circuit.

11. In a feedback type oscillator system comprising a transistor having an output element, an input element and a common element, a resonant network between said output and said input element comprising a series resonant circuit and a low impedance winding shunted across and inductively coupled to said series resonant circuit, a capacitive divider network comprising a first condenser connected between said output element and said common element, a second condenser connected between said input element and said common element, said condensers having been selected to satisfy the Barkhausen criteria for sustained oscillations and to produce maximum frequency stability consistent therewith, the combination comprising a biasing network including a source of biasing voltage connected across first and second resistors, a current limiting negative feedback resistor connected in series with said common element, said first resistor and said input element, whereby the voltage developed across said current limiting negative feedback resistor and said first resistor is impressed across said second condenser to bias the input and common elements of said transistor, and circuit means connecting said second resistor to said output element through said resonant network, whereby oscillations are started by a current surge in said resonant network and are sustained by feedback to said capacitive divider network and whereby the voltages developed in said current limiting resistor and said first resistor are in opposition to the feedback to the capacitive divider network and tend to establish a stable operating condition of the system.

12. A high frequency transistorized oscillator comprising: a transistor having base, emitter and collector electrodes; a capacitive voltage divider comprising a first condenser connected between said collector and emitter electrodes, and a second condenser connected between said emitter and base electrodes; a resonant network connected for alternating current between said collector electrode and said base electrode, said resonant network comprising a series-resonant tank shunted by a low impedance inductor; a direct current biasing circuit for said transistor including a resistor connected from said emitter to a point of reference potential; a source of direct current potential connected between said point of reference potential and said collector through said low impedance inductive shunt, and first and second series-connected resistors connected across said source, the junction between said first and second resistors being connected to said base electrode.

References Cited in the file of this patent

UNITED STATES PATENTS

| | | |
|---|---|---|
| 2,755,384 | Pierson et al. | July 17, 1956 |
| 2,760,070 | Keonjian | Aug. 21, 1956 |
| 2,764,643 | Sulzer | Sept. 25, 1956 |